(12) United States Patent
Obikane et al.

(10) Patent No.: US 12,557,592 B2
(45) Date of Patent: Feb. 17, 2026

(54) PROCESSING APPARATUS AND SUBSTRATE TRANSFER METHOD WITH FIRST AND SECOND SUCTION PATHS

(71) Applicant: Tokyo Electron Limited, Tokyo (JP)

(72) Inventors: Tadashi Obikane, Yamanashi (JP); Fumito Kagami, Yamanashi (JP); Kaori Arai, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 219 days.

(21) Appl. No.: 18/551,287

(22) PCT Filed: Mar. 16, 2022

(86) PCT No.: PCT/JP2022/011821
§ 371 (c)(1),
(2) Date: Sep. 19, 2023

(87) PCT Pub. No.: WO2022/209888
PCT Pub. Date: Oct. 6, 2022

(65) Prior Publication Data
US 2024/0178034 A1 May 30, 2024

(30) Foreign Application Priority Data
Mar. 30, 2021 (JP) .................................. 2021-057717

(51) Int. Cl.
*H01L 21/677* (2006.01)
*H01L 21/67* (2006.01)
*H01L 21/673* (2006.01)
*H01L 21/683* (2006.01)

(52) U.S. Cl.
CPC .. *H01L 21/67766* (2013.01); *H01L 21/67253* (2013.01); *H01L 21/67346* (2013.01); *H01L 21/6838* (2013.01)

(58) Field of Classification Search
CPC ... B25J 9/042; B25J 9/043; B25J 15/06; B25J 15/0616; B25J 15/0625; B25J 15/0641; H01L 21/67766; H01L 21/67253; H01L 21/67346; H01L 21/6838
See application file for complete search history.

(56) References Cited

U.S. PATENT DOCUMENTS

2007/0297878 A1* 12/2007 Masutani ............ H01L 21/6838
414/806

FOREIGN PATENT DOCUMENTS

| JP | H0742138 U | * | 7/1995 |
| JP | 2008-004601 | | 1/2008 |
| JP | 2013-197375 | | 9/2013 |
| KR | 10-2019-0143740 | | 12/2019 |

* cited by examiner

*Primary Examiner* — Gerald McClain
(74) *Attorney, Agent, or Firm* — IPUSA, PLLC

(57) ABSTRACT

A processing apparatus includes a pick configured to hold and transfer a substrate, a first suction pad disposed at a position in the pick where the first suction pad comes into contact with a concavely curved substrate, a second suction pad disposed at a position in the pick where the second suction pad comes into contact with a convexly curved substrate, a pressure sensor configured to detect a pressure in a first suction path connected to the first suction pad and a pressure in a second suction path connected to the second suction pad, and a controller configured to control suction operations by the first suction pad and the second suction pad based on a detection value of the pressure sensor.

6 Claims, 9 Drawing Sheets

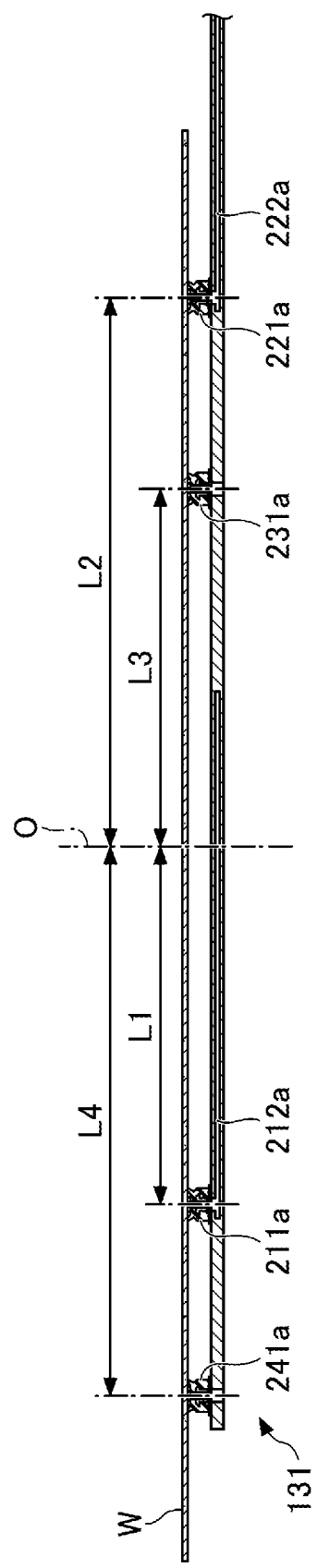

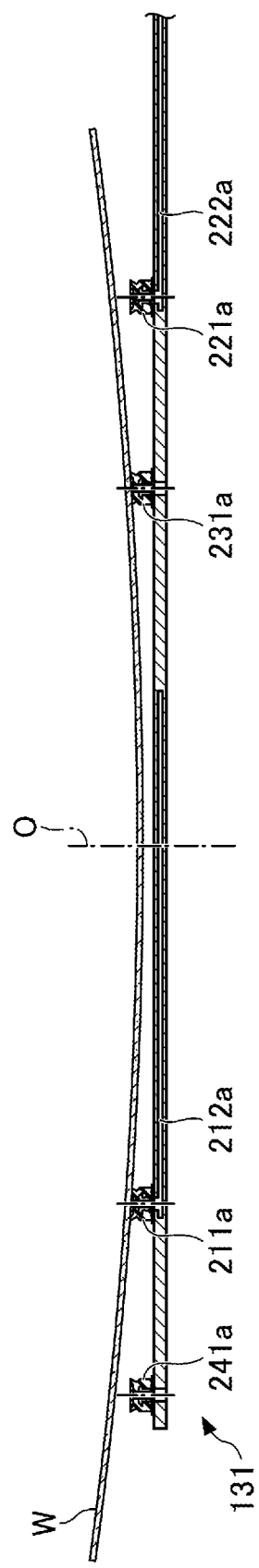

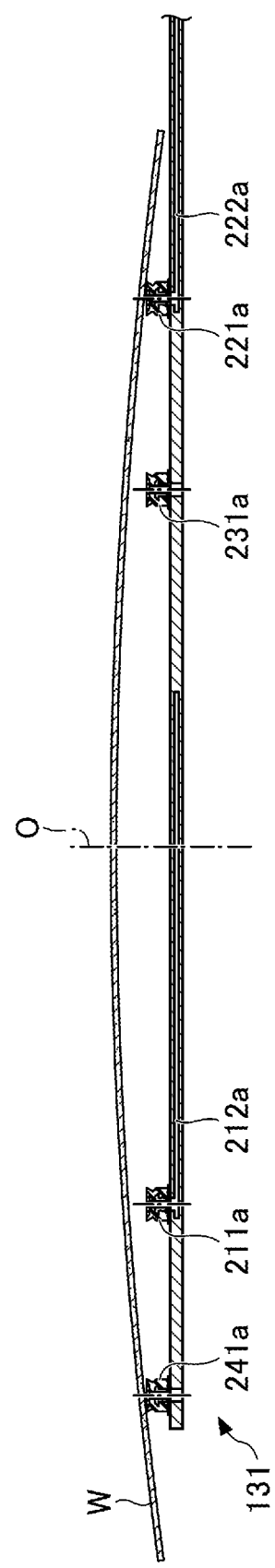

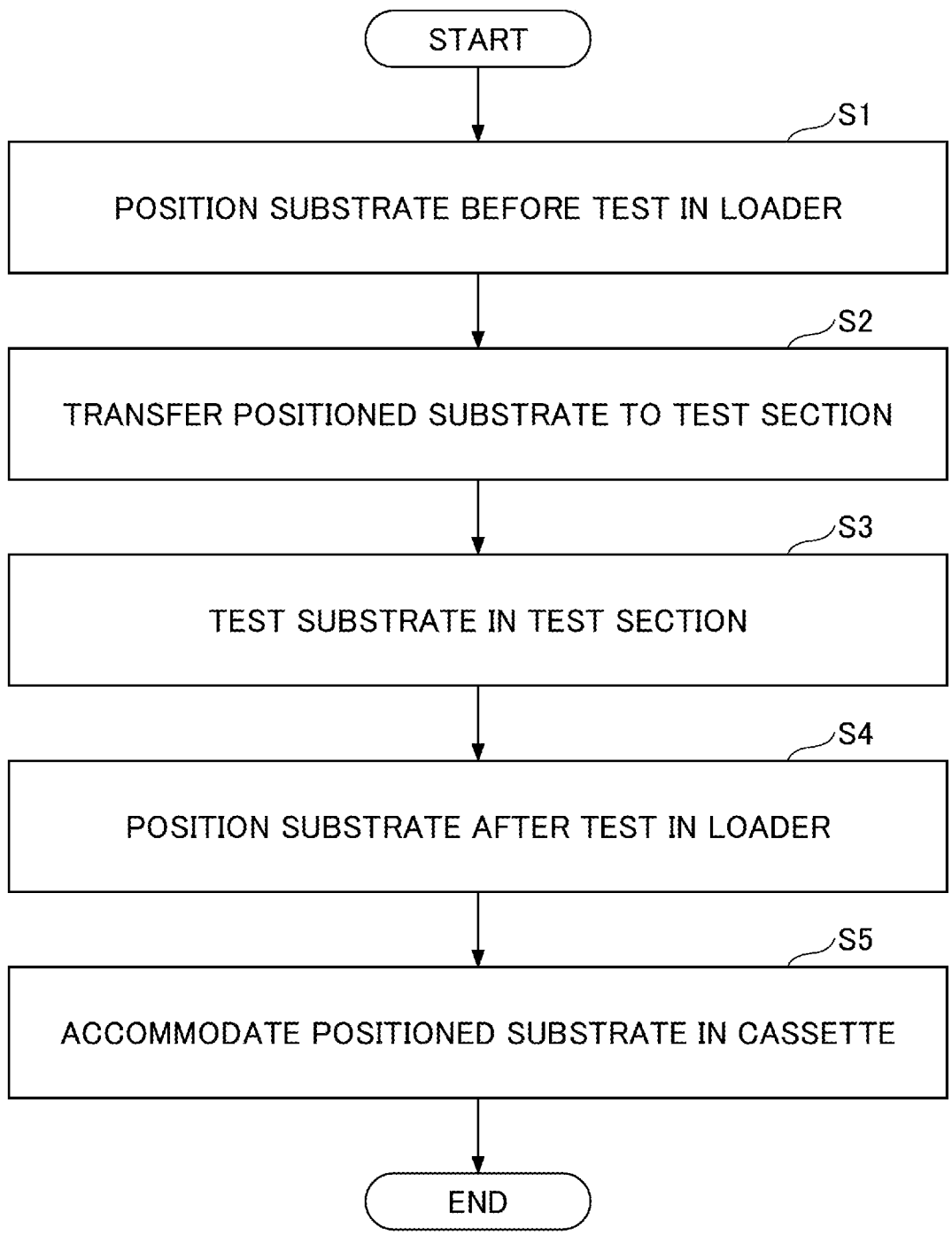

PROCESSING APPARATUS AND SUBSTRATE TRANSFER METHOD WITH FIRST AND SECOND SUCTION PATHS

TECHNICAL FIELD

The present disclosure relates to a processing apparatus and a substrate transfer method.

BACKGROUND

A probe device including a wafer transfer mechanism that can transfer a semiconductor wafer between a semiconductor wafer accommodating container and a stage for performing electrical measurement is known (see, for example, Patent Document 1).

CITATION LIST

Patent Document

[Patent Document 1] Japanese Laid-open Patent Application Publication No. 2013-197375

SUMMARY

Problem to be Solved by the Invention

The present disclosure provides a technique that enables suctioning and transferring a warped substrate.

Means for Solving Problem

A processing apparatus according to an aspect of the present disclosure includes a pick configured to hold and transfer a substrate, a first suction pad disposed at a position in the pick where the first suction pad comes into contact with a concavely curved substrate, a second suction pad disposed at a position in the pick where the second suction pad comes into contact with a convexly curved substrate, a pressure sensor configured to detect a pressure in a first suction path connected to the first suction pad and a pressure in a second suction path connected to the second suction pad, and a controller configured to control suction operations by the first suction pad and the second suction pad based on a detection value of the pressure sensor.

Effect of Invention

According to the present disclosure, a warped substrate can be suctioned and transferred.

BRIEF DESCRIPTION OF THE DRAWINGS

FIG. 5A is a cross-sectional view illustrating an example of the pick.

FIG. 5B is a cross-sectional view illustrating an example of the pick.

FIG. 5C is a cross-sectional view illustrating an example of the pick.

FIG. 7 is a flowchart illustrating an example of a test method according to an embodiment.

DESCRIPTION OF EMBODIMENTS

In the following, non-restrictive exemplary embodiments of the present disclosure will be described with reference to the accompanying drawings. In all of the accompanying drawings, the same or corresponding members or components are denoted by the same or corresponding reference symbols, and duplicated description is omitted.

[Test Device]

Figure 1:
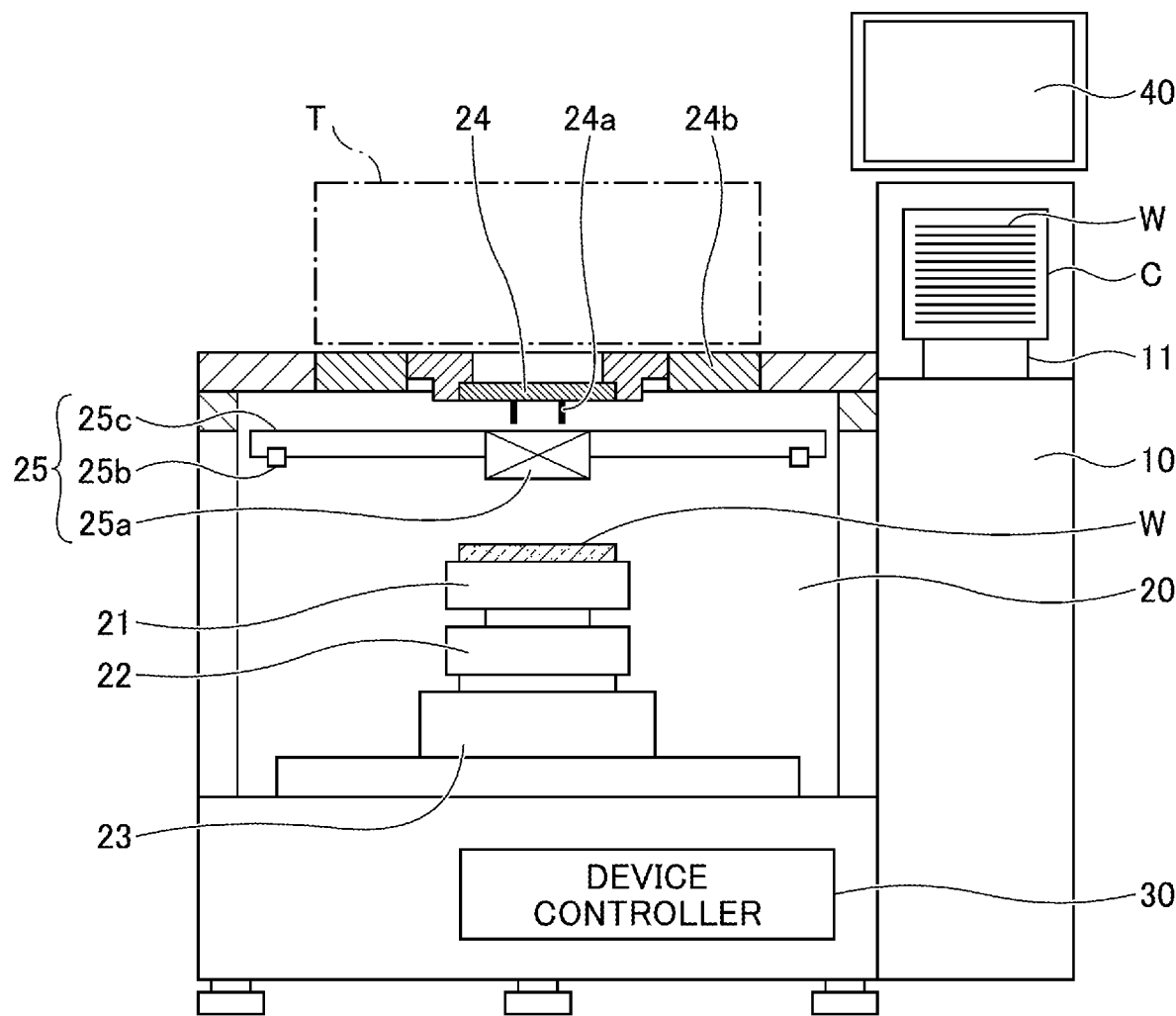
FIG. 1 is a front view illustrating an example of a test device according to an embodiment.
Figure 2:
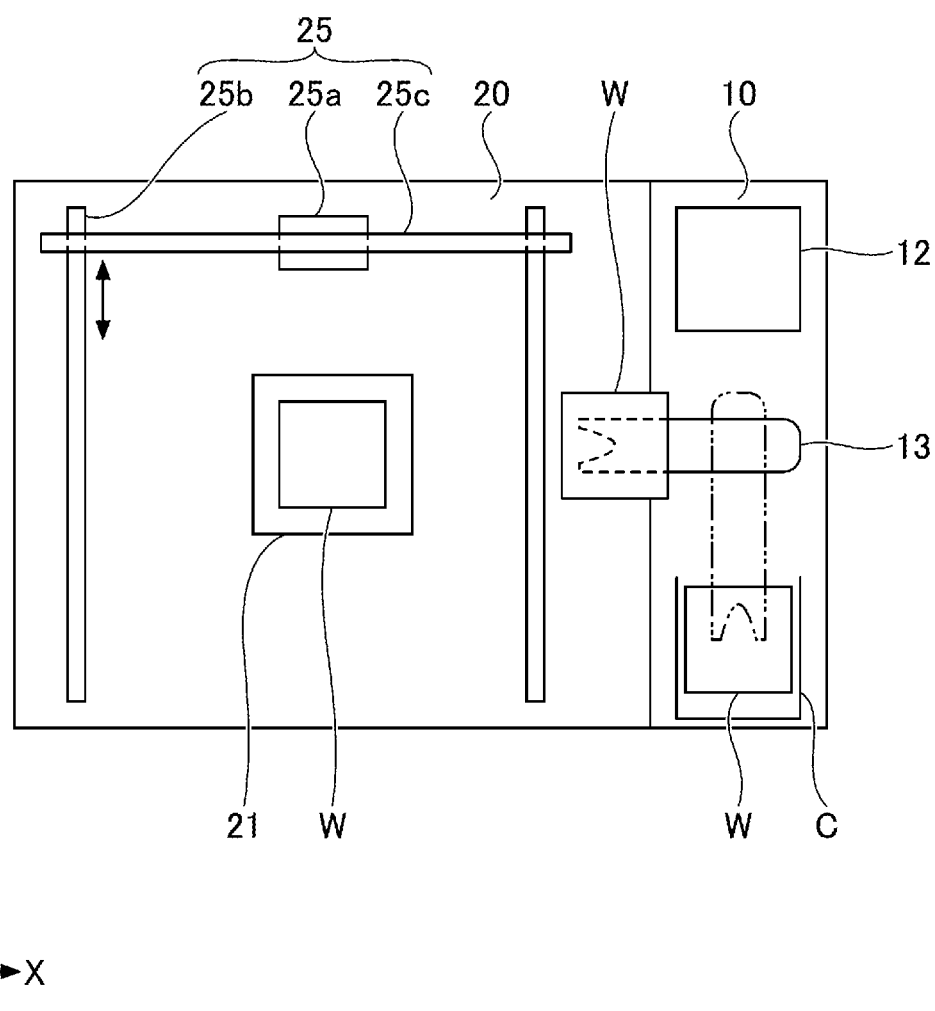
FIG. 2 is a top view illustrating an example of the test device of the embodiment.
Figure 3:
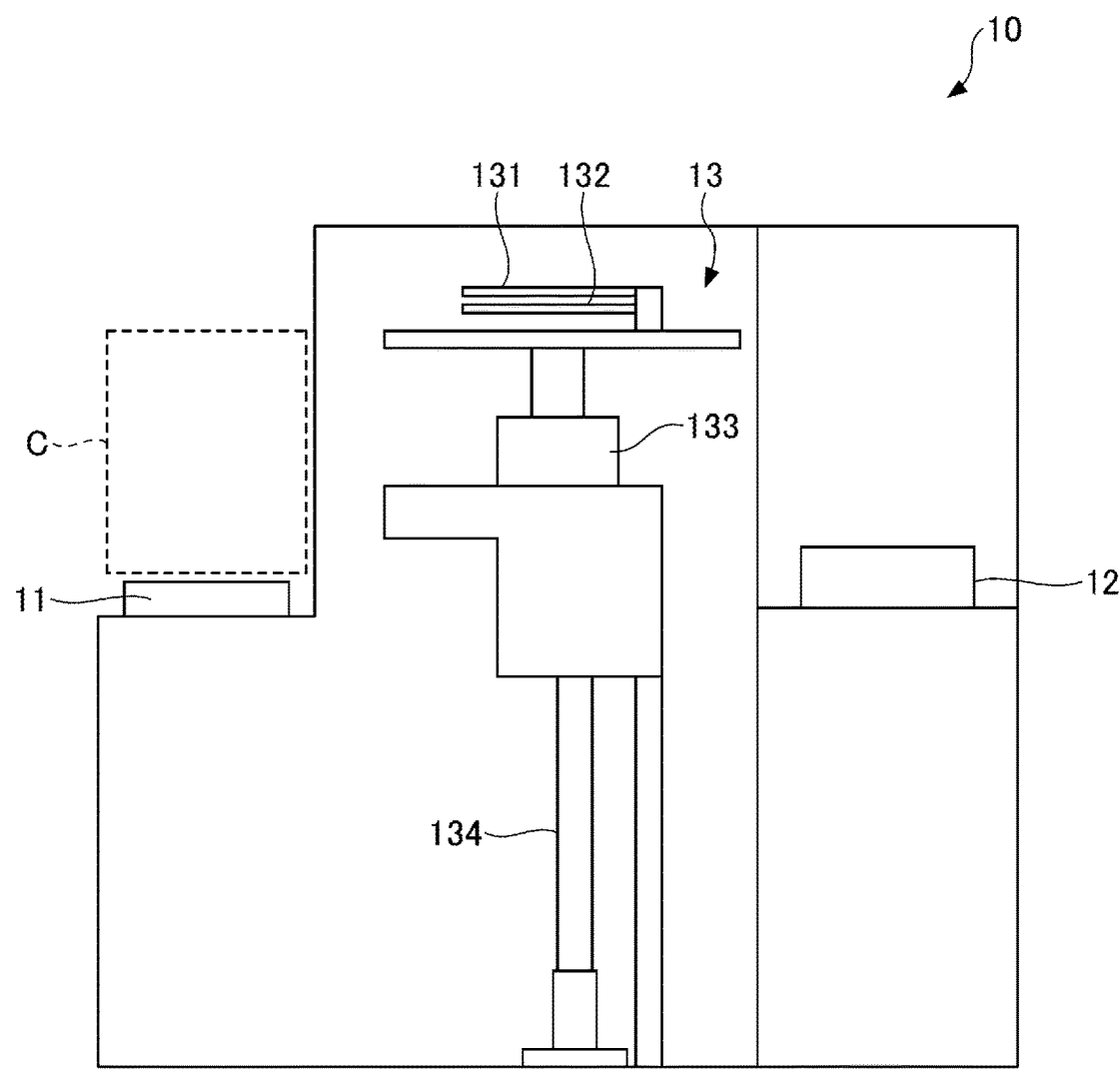
FIG. 3 is a diagram illustrating an example of a loader.

An example of a test device according to an embodiment will be described with reference to FIGS. 1 to 3. FIG. 1 is a front view illustrating an example of the test device according to the embodiment. FIG. 2 is a top view illustrating an example of the test device of the embodiment. FIG. 3 is a diagram illustrating an example of a loader.

A test device 1 includes a loader 10, a test section 20, a device controller 30, and the like. Under the control of the device controller 30, the test device 1 transfers a substrate W to be tested from the loader 10 to the test section 20, and applies an electrical signal to a device under test (DUT) formed on the substrate W to test various electrical characteristics. The substrate W may be, for example, a rectangular substrate. Examples of the rectangular substrate include a panel level package (PLP). However, the substrate W may be, for example, a circular substrate.

The loader 10 includes a load port 11, an aligner 12, a substrate transfer mechanism 13, and the like.

The load port 11 is provided on the front (−Y direction) side of the test device 1. A cassette C accommodating the substrate W is placed on the load port 11.

The aligner 12 is provided on the back surface (+Y direction) side of the test device 1. The aligner 12 positions the substrate W.

The substrate transfer mechanism 13 transfers the substrate W between the cassette C mounted on the load port 11, the aligner 12, and a stage 21, which will be described later. The substrate transfer mechanism 13 includes picks 131 and 132, a rotation drive mechanism 133, a vertical drive mechanism 134, and the like.

The picks 131 and 132 are provided in upper and lower two stages. Each of the picks 131 and 132 holds the substrate W. The picks 131 and 132 are also referred to as forks or end effectors.

The rotation drive mechanism 133 is provided below the picks 131 and 132 and rotationally drives the picks 131 and 132. The rotation drive mechanism 133 includes, for example, a stepping motor.

The vertical drive mechanism 134 is provided below the rotation drive mechanism 133, and vertically drives the picks 131 and 132 and the rotation drive mechanism 133. The vertical drive mechanism 134 includes, for example, a stepping motor. Here, the substrate transfer mechanism 13 is not limited to the form illustrated in FIG. 3, and may have, for example, an articulated arm and a vertical drive mechanism.

The test section 20 is disposed adjacent to the loader 10. The test section 20 includes the stage 21, a raising/lowering mechanism 22, an XY stage 23, a probe card 24, an alignment mechanism 25, and the like.

The stage 21 mounts and holds the substrate W. The stage 21 includes, for example, a vacuum chuck.

The raising/lowering mechanism 22 is provided below the stage 21 and raises and lowers the stage 21 with respect to the XY stage 23. The raising/lowering mechanism 22 includes, for example, a stepping motor.

The XY stage 23 is provided below the raising/lowering mechanism 22 and moves the stage 21 and the raising/lowering mechanism 22 in two axial directions (the X direction and the Y direction in the drawing). The XY stage 23 is fixed to a bottom of the test section 20. The XY stage 23 includes, for example, a stepping motor.

The probe card 24 is disposed above the stage 21. Multiple probes 24a are formed on the stage 21 side of the probe card 24. The probe card 24 is detachably attached to a head plate 24b. A tester (not illustrated) is connected to the probe card 24 via a test head T.

The alignment mechanism 25 includes a camera 25a, a guide rail 25b, an alignment bridge 25c, and the like. The camera 25a is attached to the center of the alignment bridge 25c to face downward and captures images of the stage 21, the substrate W, and the like. The camera 25a is, for example, a CCD camera or a CMOS camera. The guide rail 25b supports the alignment bridge 25c to be movable in the horizontal direction (the Y direction in the drawing). The alignment bridge 25c is supported by the pair of left and right guide rails 25b and moves in the horizontal direction (the Y direction in the drawing) along the guide rails 25b. With this, the camera 25a moves between the standby position and a position directly below the center of the probe card 24 (hereinafter referred to as a "probe center") via the alignment bridge 25c. During alignment, the camera 25a located at the probe center captures an electrode pad of the substrate W on the stage 21 from above while the stage 21 moves in the XY direction, performs image processing, and displays the captured image on the display device 40.

The device controller 30 is provided below the stage 21 and controls the overall operation of the test device 1. The CPU provided in the device controller 30 performs a desired test in accordance with a product type parameter stored in the memory such as the ROM or the RAM. The desired test includes a substrate transfer method, a test method, and the like, which will be described later. Here, the product type parameter may be stored in a semiconductor memory other than a hard disk, the ROM, and the RAM. Additionally, in a state where the product type parameter is recorded in a computer-readable recording medium such as a CD-ROM or a DVD, the product type parameter may be read by the recording media being inserted into a predetermined position.

[Pick]

Figure 4:
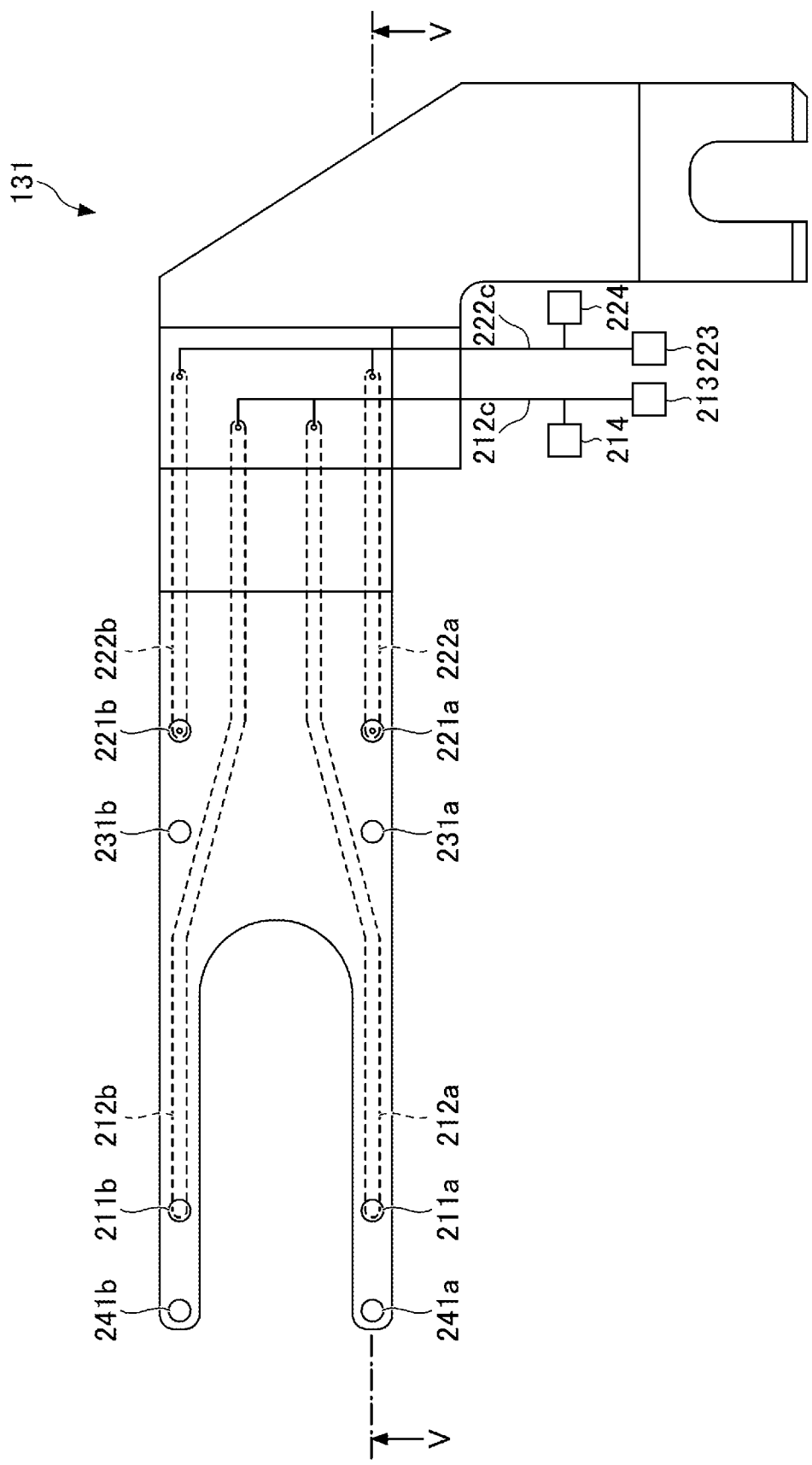
FIG. 4 is a top view illustrating an example of a pick.

An example of the pick 131 included in the test device 1 according to the embodiment will be described with reference to FIGS. 4 and 5A to 5C. FIG. 4 is a top view illustrating an example of the pick 131. FIG. 5A to 5C are cross-sectional views illustrating an example of the pick 131, and illustrates a cross section taken along the dash-dot-dash line V-V in FIG. 4. FIG. 5A illustrates the pick 131 holding a substrate W without warpage, FIG. 5B illustrates the pick 131 holding a concavely curved substrate W, and FIG. 5C illustrates the pick 131 holding a convexly curved substrate W. Here, the pick 132 may have the same configuration as that of the pick 131.

The pick 131 is configured to hold the substrate W. The pick 131 has a substantially U-shape on the tip end side. On the upper surface of the pick 131, first suction pads 211a and 211b, second suction pads 221a and 221b, first support pads 231a and 231b, and second support pads 241a and 241b are provided. The first suction pads 211a and 211b and the second suction pads 221a and 221b hold the substrate W by vacuum suction. The first support pads 231a and 231b and the second support pads 241a and 241b support the substrate W without vacuum suction.

The first suction pads 211a and 211b are disposed at positions where the first suction pads 211a and 211b come into contact with the concavely curved substrate W. In the present embodiment, the first suction pads 211a and 211b are disposed on the tip end side of the pick 131 with respect to the center O of the substrate W held by the pick 131. The first suction pad 211a and the first suction pad 211b are disposed on different tip end sides of the substantially U-shape of the pick 131. The first suction pad 211a is suctioned via the first suction paths 212a and 212c. The first suction pad 211b is suctioned via the first suction paths 212b and 212c. A first valve 213 is provided in the first suction path 212c. The first valve 213 opens and closes the first suction path 212c based on a command from the device controller 30. When the first suction path 212c is opened by the first valve 213, the suction by the first suction pads 211a and 211b is started. When the first suction path 212c is closed by the first valve 213, the suction by the first suction pads 211a and 211b is stopped. The first valve 213 may be, for example, an electromagnetic valve. Additionally, a first pressure sensor 214 is provided in the first suction path 212c. The first pressure sensor 214 detects the pressure in the first suction path 212c and transmits the detection value to the device controller 30.

The second suction pads 221a and 221b are disposed at positions where the second suction pads 221a and 221b come into contact with the convexly curved substrate W. In the present embodiment, the second suction pads 221a and 221b are disposed on the base end side of the pick 131 with respect to the center O of the substrate W held by the pick 131. The second suction pads 221a and 221b are provided at positions further away from the center O of the substrate W than the first suction pads 211a and 211b. The second suction pad 221a is suctioned via the second suction paths 222a and 222c. The second suction pad 221b is suctioned via the second suction paths 222b and 222c. A second valve 223 is provided in the second suction path 222c. The second valve 223 opens and closes the second suction path 222c based on a command from the device controller 30. When the second suction path 222c is opened by the second valve 223, the suction by the second suction pads 221a and 221b is started. When the second suction path 222c is closed by the second valve 223, the suction by the second suction pads 221a and 221b is stopped. The second valve 223 may be, for example, an electromagnetic valve. Additionally, a second pressure sensor 224 is provided in the second suction path 222c. The second pressure sensor 224 detects the pressure in the second suction path 222c and transmits the detection value to the device controller 30.

The first support pads 231a and 231b are disposed to support the concavely curved substrate W. In the present embodiment, the first support pads 231a and 231b are disposed on the base end side of the pick 131 with respect to the center O of the substrate W held by the pick 131. The first support pads 231a and 231b are disposed such that a distance L3 from the center O of the substrate W to the first support pads 231a and 231b is equal to a distance L1 from the center O of the substrate W to the first suction pads 211a and 211b in the advancing/retracting direction of the pick 131. For example, the distances L1 and L3 may be 75 mm.

The second support pads 241a and 241b are disposed to support the convexly curved substrate W. In the present embodiment, the second support pads 241a and 241b are disposed on the tip end side of the pick 131 with respect to the center O of the substrate W held by the pick 131. The second support pad 241a and the second support pad 241b are disposed on different tip end sides of the substantially U-shape of the pick 131. The second support pads 241a and 241b are provided at positions further away from the center O of the substrate W than the first support pads 231a and 231b. The second support pads 241a and 241b are disposed such that a distance L4 from the center O of the substrate W to the second support pads 241a and 241b is equal to a distance L2 from the center O of the substrate W to the second suction pads 221a and 221b in the advancing/retracting direction of the pick 131. For example, the distances L2 and L4 may be 115 mm.

The pick 131 of the embodiment described above includes the first suction pads 211a and 211b and the first support pads 231a and 231b disposed at positions where the first suction pads 211a and 211b and the first support pads 231a and 231b come into contact with the concavely curved substrate W. Additionally, the pick 131 includes the second suction pads 221a and 221b and the second support pads 241a and 241b disposed at positions where the second suction pads 221a and 221b and the second support pads 241a and 241b come into contact with the convexly curved substrate W. With this, the pads that are in contact with the concavely curved substrate W and the pads that are in contact with the convexly curved substrate W can be separated. As a result, the height of the pad can be reduced. Additionally, because the pads can be evenly disposed with respect to the center O of the substrate W, the inclination of the substrate W when the substrate W is held by the pick 131 can be suppressed. As a result, restrictions on an area in which the pick 131 is inserted and an area in which the pick 131 moves can be reduced.

Here, in the example of FIGS. 4 and 5A to 5C, the case where the first suction pads 211a and 211b are disposed on the tip end side of the pick 131 with respect to the center O and the second suction pads 221a and 221b are disposed on the base end side of the pick 131 with respect to the center O has been described. However, the positional relationship of the pads is not limited thereto.

For example, the first suction pads 211a and 211b may be disposed on the base end side of the pick 131 with respect to the center O, and the second suction pads 221a and 221b may be disposed on the tip end side of the pick 131 with respect to the center O. In this case, the first support pads 231a and 231b are disposed on the tip end side of the pick 131 with respect to the center O, and the second support pads 241a and 241b are disposed on the base end side of the pick 131 with respect to the center O.

Additionally, for example, both the first suction pads 211a and 211b and the second suction pads 221a and 221b may be disposed on the base end side of the pick 131 with respect to the center O. In this case, both the first support pads 231a and 231b and the second support pads 241a and 241b are disposed on the tip end side of the pick 131 with respect to the center O.

Additionally, for example, both the first suction pads 211a and 211b and the second suction pads 221a and 221b may be disposed on the tip end side of the pick 131 with respect to the center O. In this case, both the first support pads 231a and 231b and the second support pads 241a and 241b are disposed on the base end side of the pick 131 with respect to the center O.

Additionally, in the example of FIGS. 4 and 5A to 5C, the two first suction pads 211a and 211b and the two second suction pads 221a and 221b are disposed on the pick 131. However, the number of the first suction pads 211a and 211b and the second suction pads 221a and 221b is not limited thereto. For example, four first suction pads and four second suction pads may be disposed on the pick 131. In this case, it is preferable that two first suction pads and two second suction pads are disposed on the tip end side of the pick 131 with respect to the center O, and the remaining two first suction pads and two second suction pads are disposed on the base end side of the pick 131 with respect to the center O. In this case, the first support pads 231a and 231b and the second support pads 241a and 241b need not be disposed.

[Substrate Transfer Method]

Figure 6:
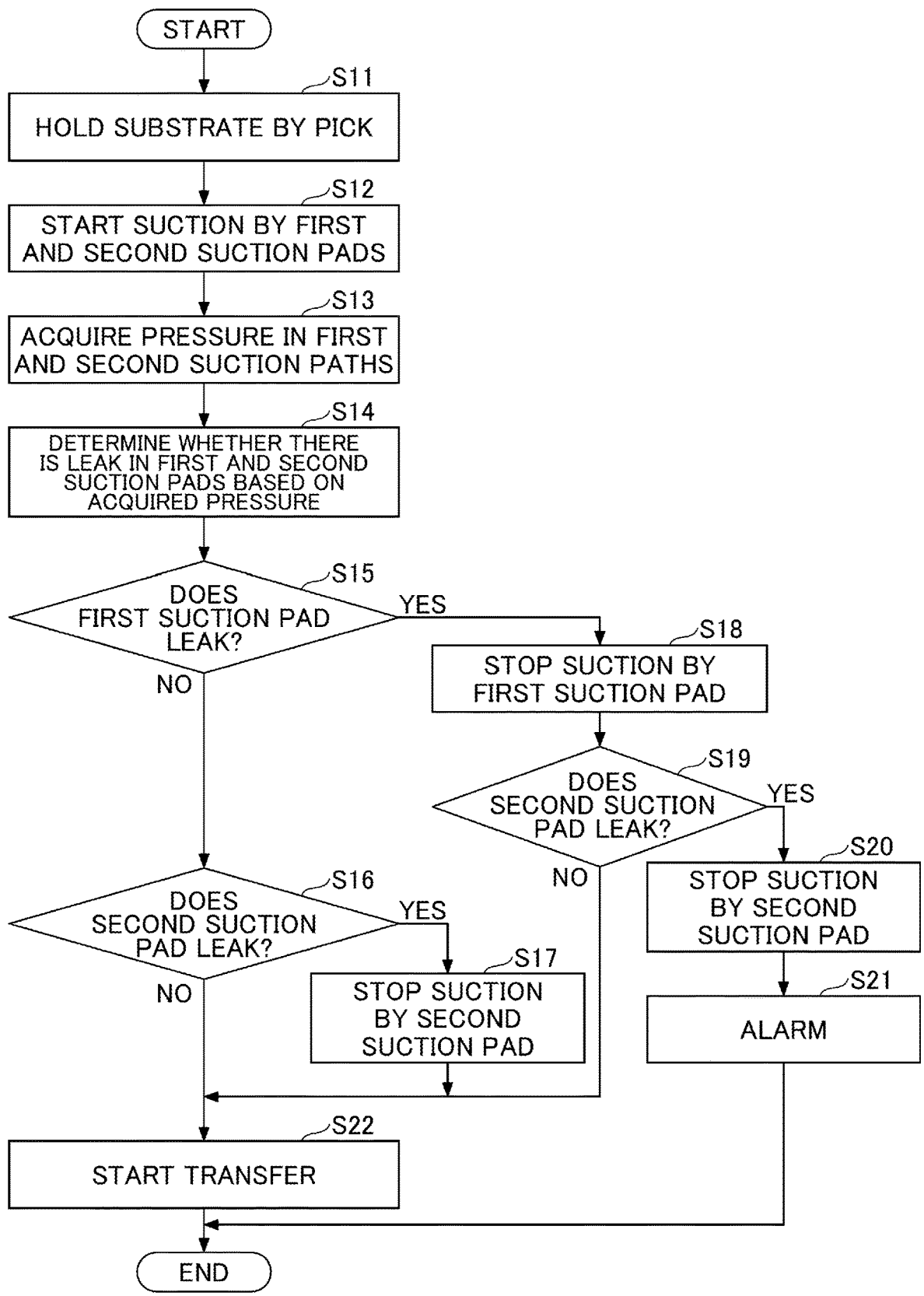
FIG. 6 is a flowchart illustrating an example of a substrate transfer method according to an embodiment.

An example of a method of transferring the substrate W by the above-described substrate transfer mechanism 13 will be described with reference to FIG. 6. FIG. 6 is a flowchart illustrating an example of a substrate transfer method according to the embodiment. In the following, a case in which the device controller 30 controls the suction operations by the first suction pads 211a and 211b and the second suction pads 221a and 221b based on the detection values of the first pressure sensor 214 and the second pressure sensor 224, to transfer the substrate W by the pick 131 will be described. However, another controller may be used instead of the device controller 30. The same applies to a case where the substrate W is transferred by the pick 132.

First, the device controller 30 controls the substrate transfer mechanism 13 to hold the substrate W by the pick 131 (step S11).

Next, the device controller 30 opens the first valve 213 and the second valve 223 to start the suction by the first suction pads 211a and 211b and the second suction pads 221a and 221b (step S12).

Next, the device controller 30 acquires the pressure in the first suction path 212c and the pressure in the second suction path 222c based on the detection values of the first pressure sensor 214 and the second pressure sensor 224 (step S13).

Next, the device controller 30 determines whether there is a leak in the first suction pads 211a and 211b and the second suction pads 221a and 221b based on the pressure in the first suction path 212c and the pressure in the second suction path 222c acquired in step S13 (step S14). For example, if the pressure in the first suction path 212c is greater than or equal to a first threshold and the pressure in the second suction path 222c is greater than or equal to a second threshold, the device controller 30 determines that there is no leak in the first suction pads 211a and 211b and the second suction pads 221a and 221b. For example, if the pressure in the first suction path 212c is greater than or equal to the first threshold and the pressure in the second suction path 222c is less than the second threshold, the device controller 30 determines that there is no leak in the first suction pads 211a and 211b and there is a leak in the second suction pads 221a and 221b. For example, if the pressure in the first suction path 212c is less than the first threshold and the pressure in the second suction path 222c is greater than or equal to the second threshold, the device controller 30 determines that there is a leak in the first suction pads 211a and 211b and there is no leak in the second suction pads 221a and 221b. For example, if the pressure in the first suction path 212c is less than the first threshold and the pressure in the second suction path 222c is less than the second threshold, the device controller 30 determines that there is a leak in the first suction pads 211a and 211b and the second suction pads 221a and 221b. Here, the first threshold and the second threshold may be the same values or may be different values.

Next, based on the result determined in step S14, the device controller 30 determines whether there is a leak in the first suction pads 211a and 211b (step S15).

In step S15, if it is determined that there is no leak in the first suction pads 211a and 211b, the device controller 30 determines whether there is a leak in the second suction pads 221a and 221b based on the result determined in step S14 (step S16). When it is determined in step S16 that there is no leak in the second suction pads 221a and 221b, the device controller 30 controls the substrate transfer mechanism 13 to start the transfer of the substrate W (step S22). At this time, the substrate W is transferred in a state of being suctioned and held by the first suction pads 211a and 211b and the second suction pads 221a and 221b and supported by the first support pads 231a and 231b and the second support pads 241a and 241b. In step S16, when it is determined that there is a leak in the second suction pads 221a and 221b, the device controller 30 closes the second valve 223 to stop the suction by the second suction pads 221a and 221b (step S17). Subsequently, the device controller 30 controls the substrate transfer mechanism 13 to start the transfer of the substrate W (step S22). At this time, the substrate W is transferred in a state of being suctioned and held by the first suction pads 211a and 211b and supported by the first support pads 231a and 231b.

If it is determined in step S15 that there is a leak in the first suction pads 211a and 211b, the device controller 30 closes the first valve 213 to stop the suction by the first suction pads 211a and 211b (step S18). Subsequently, the device controller 30 determines whether there is a leak in the second suction pads 221a and 221b based on the result determined in step S14 (step S19). If it is determined in step S19 that there is no leak in the second suction pads 221a and 221b, the device controller 30 controls the substrate transfer mechanism 13 to start the transfer of the substrate W (step S22). At this time, the substrate W is transferred in a state of being suctioned and held by the second suction pads 221a and 221b and supported by the second support pads 241a and 241b. If it is determined in step S19 that there is a leak in the second suction pads 221a and 221b, the device controller 30 closes the second valve 223 to stop the suction by the second suction pads 221a and 221b (step S20). Subsequently, the device controller 30 activates an alarm (step S21) and ends the process.

According to the substrate transfer method of the embodiment described above, the suction pads that are in contact with the substrate W and the suction pads that are not in contact with the substrate W are identified, and the substrate W is transferred in a state in which the suction of the suction pads that are not in contact with the substrate W is stopped. This can suppress a leak from the suction pads that are not in contact with the substrate W, thereby increasing the suction force of the suction pads that are in contact with the substrate W. As a result, even a substrate W that is not in contact with all the suction pads, for example, a warped substrate W can be transferred in a state of being suctioned and held by the suction pads.

For example, when the concavely curved substrate W is transferred, the substrate W can be transferred in a state of being suctioned and held by the first suction pads 211a and 211b and supported by the first support pads 231a and 231b. For example, when the convexly curved substrate W is transferred, the substrate W can be transferred in a state of being suctioned and held by the second suction pads 221a and 221b and supported by the second support pads 241a and 241b. For example, when the substrate W having no warp is transferred, the substrate W can be transferred in a state of being suctioned and held by the first suction pads 211a and 211b and the second suction pads 221a and 221b and supported by the first support pads 231a and 231b and the second support pads 241a and 241b. Additionally, the substrate W having a small warp can be transferred in substantially the same manner as the substrate W having no warp.

[Test Method]

An example of a test method when the substrate W is tested in the above-described test device 1 will be described with reference to FIG. 7. FIG. 7 is a flowchart illustrating an example of the test method according to the embodiment.

In step S1, the substrate W before testing is positioned in the loader 10. In the present embodiment, first, the device controller 30 controls the substrate transfer mechanism 13 to transfer the substrate W accommodated in the cassette C to the aligner 12. At this time, the substrate W is transferred by the above-described substrate transfer method. Next, the device controller 30 controls the aligner 12 to position the substrate W.

In step S2, the substrate W before testing positioned in step S1 is transferred to the test section 20. In the present embodiment, the device controller 30 controls the substrate transfer mechanism 13 to transfer the substrate W positioned by the aligner 12 to the test section 20 and place the substrate W on the stage 21. At this time, the substrate W is transferred by the above-described substrate transfer method.

In step S3, the substrate W is tested in the test section 20. In the present embodiment, the device controller 30 controls the alignment mechanism 25 to align the positions of the electrode pads of the device under test formed on the substrate W on the stage 21 with the positions of multiple probes 24a of the probe card 24. Next, the device controller 30 controls the raising/lowering mechanism 22 to raise the stage 21 and bring the multiple probes 24a of the probe card 24 into contact with the corresponding electrode pads. Next, the device controller 30 applies the test signal from the tester to the device under test formed on the substrate W, via the test head T and the multiple probes 24a of the probe card 24, to test the electrical characteristics of the device under test. After the test of the electrical characteristics of the device under test is completed, the device controller 30 controls the raising/lowering mechanism 22 to lower the stage 21 and separate the probes 24a from the electrode pads.

In step S4, the substrate W after testing is positioned in the loader 10. The positioning of the substrate W after the test can be performed by the same method as the positioning of the substrate W before the test in step S1.

In step S5, the substrate W after testing is accommodated in the cassette C. In the present embodiment, the device controller 30 controls the substrate transfer mechanism 13 to transfer the substrate W after testing positioned in the loader 10 to the cassette C and accommodate the substrate W therein. At this time, the substrate W is transferred by the above-described substrate transfer method.

According to the test method of the embodiment described above, when the substrate transfer mechanism 13 transfers the substrate W, the substrate W is transferred by the substrate transfer method of the above-described embodiment. That is, the suction pads that are in contact with the substrate W and the suction pads that are not in contact with the substrate W are identified, and the substrate W is transferred in a state in which the suction of the suction pads that are not in contact with the substrate W is stopped. This can suppress a leak from the suction pads that are not in contact with the substrate W, thereby increasing the suction force of the suction pads that are in contact with the substrate W. As a result, even a substrate W that is not in contact with all the suction pads, for example, a warped substrate W can be transferred in a state of being suctioned and held by the suction pads. As a result, a warped substrate W can be tested in the test device 1.

Here, in the example of FIG. 7, the case in which the positioning with respect to the substrate W before testing (step S1) and the positioning with respect to the substrate W after testing (step S4) are performed has been described, but the present disclosure is not limited thereto. For example, either the positioning of the substrate W before testing (step S1) or the positioning of the substrate W after testing (step S4) may be omitted.

Here, in the above-described embodiments, the device controller 30 is an example of a controller.

It should be understood that the embodiments disclosed herein are illustrative in all respects and are not restrictive. Omission, replacement, and change can be made on the above-described embodiments in various forms without departing from the scope and spirit of the appended claims.

Although the test device 1 has been described as an example in the embodiments described above, the present disclosure is not limited thereto. Instead of the test device 1, the present disclosure may be applied to another processing apparatus such as a film deposition apparatus that forms a film on the substrate W, and an etching apparatus that etches a film formed on the substrate W.

The present international application is based upon and claims the priority to Japanese Patent Application No. 2021-057717 filed on Mar. 30, 2021, the entire contents of which are incorporated herein by reference.

DESCRIPTION OF REFERENCE SYMBOLS 1 test device
30 device controller
131, 132 pick
211a, 211b first suction pad
212a to 212c first suction path
214 first pressure sensor
221a, 221b second suction pad
222a to 222c second suction path
224 second pressure sensor
W substrate

The invention claimed is:

1. A processing apparatus comprising:
a pick configured to hold and transfer a substrate;
a first suction pad disposed in the pick;
a second suction pad disposed in the pick;
a first support pad provided on the pick and configured to support the substrate;
a second support pad provided in the pick and configured to support the substrate;
a pressure sensor configured to detect a pressure in a first suction path connected to the first suction pad and a pressure in a second suction path connected to the second suction pad; and
a controller configured to control suction operations by the first suction pad and the second suction pad based on a detection value of the pressure sensor,
wherein the first suction pad and the first support pad are disposed at different positions that are at equal distances from a center of the substrate,
wherein the second suction pad and the second support pad are disposed at different positions that are at equal distances from the center of the substrate,
wherein a distance between the second suction pad and the center of the substrate is greater than a distance between the first suction pad and the center of the substrate,
wherein a distance between the second support pad and the center of the substrate is greater than a distance between the first support pad and the center of the substrate, and
wherein the first suction pad, the second suction pad, the first support pad, the second support pad are disposed along a single straight line.

2. The processing apparatus as claimed in claim 1, wherein the controller stops suction by either the first suction pad or the second suction pad, based on the detection value of the pressure sensor.

3. The processing apparatus as claimed in claim 1,
wherein the first suction pad is disposed on a tip end side of the pick with respect to the center of the substrate, and
wherein the second suction pad is disposed on a base end side of the pick with respect to the center of the substrate.

4. The processing apparatus as claimed in claim 1, wherein the substrate has a rectangular shape.

5. The processing apparatus as claimed in claim 1, further comprising:
a first valve configured to open and close the first suction path; and
a second valve configured to open and close the second suction path,
wherein the controller closes the first valve to stop suction by the first suction pad, and closes the second valve to stop suction by the second suction pad.

6. A method of transferring a substrate by a pick provided with a first suction pad and a second suction pad, comprising:
controlling suction operations by the first suction pad and the second suction pad based on a pressure in a suction path connected to the first suction pad and a pressure in a suction path connected to the second suction pad,
wherein a first support pad is provided on the pick and configured to support the substrate,
wherein a second support pad is provided in the pick and configured to support the substrate,
wherein the first suction pad and the first support pad are disposed at different positions that are at equal distances from a center of the substrate,
wherein the second suction pad and the second support pad are disposed at different positions that are at equal distances from the center of the substrate,
wherein a distance between the second suction pad and the center of the substrate is greater than a distance between the first suction pad and the center of the substrate,
wherein a distance between the second support pad and the center of the substrate is greater than a distance between the first support pad and the center of the substrate, and
wherein the first suction pad, the second suction pad, the first support pad, the second support pad are disposed along a single straight line.

* * * * *